US011309639B2

(12) United States Patent
Chang et al.

(10) Patent No.: US 11,309,639 B2
(45) Date of Patent: Apr. 19, 2022

(54) ANTENNA AND COMMUNICATIONS APPARATUS

(71) Applicant: Huawei Technologies Co., Ltd., Shenzhen (CN)

(72) Inventors: Ming Chang, Shanghai (CN); Liangsheng Liu, Shenzhen (CN); Qizhang Hong, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 33 days.

(21) Appl. No.: 17/020,022

(22) Filed: Sep. 14, 2020

(65) Prior Publication Data

US 2020/0412021 A1 Dec. 31, 2020

Related U.S. Application Data

(63) Continuation of application No. PCT/CN2018/120156, filed on Dec. 10, 2018.

(30) Foreign Application Priority Data

Mar. 15, 2018 (CN) ......................... 201810213756.2

(51) Int. Cl.
*H01Q 21/06* (2006.01)
*H01Q 5/371* (2015.01)
(Continued)

(52) U.S. Cl.
CPC ........... *H01Q 21/065* (2013.01); *H01Q 1/002* (2013.01); *H01Q 5/371* (2015.01); *H01Q 9/0407* (2013.01)

(58) Field of Classification Search
CPC .... H01Q 21/061; H01Q 21/065; H01Q 1/002; H01Q 1/2283; H01Q 1/38; H01Q 9/0407;
(Continued)

(56) References Cited

U.S. PATENT DOCUMENTS 6,320,547 B1 * 11/2001 Fathy .................. H01Q 21/061 343/700 MS
2002/0098970 A1 7/2002 Tomomatsu et al.
(Continued)

FOREIGN PATENT DOCUMENTS

CN 201700081 U 1/2011
CN 103367269 A 10/2013
(Continued)

OTHER PUBLICATIONS

Fukumotosho, "Polyamide Resin Brochure," Sinopec Press, 1994, 1 page.

*Primary Examiner* — Jason Crawford
(74) *Attorney, Agent, or Firm* — Conley Rose, P.C.

(57) ABSTRACT

An antenna and a communications apparatus, where the antenna includes surface radiating patches, inner radiating patches, a first dielectric substrate disposed between the surface radiating patches and the inner radiating patches, and a second dielectric substrate disposed below the inner radiating patches and configured to carry antenna feeders coupled to the inner radiating patches. A dielectric constant or dielectric loss of the first dielectric substrate is lower than that of an organic resin substrate, and a coefficient of thermal expansion of the second dielectric substrate is lower than that of the organic resin substrate.

20 Claims, 6 Drawing Sheets

(51) Int. Cl.
*H01Q 9/04* (2006.01)
*H01Q 1/00* (2006.01)

(58) Field of Classification Search
CPC ...... H01Q 9/0414; H01Q 9/0457; H01Q 5/30; H01Q 5/378; H01Q 5/385
See application file for complete search history.

(56) References Cited

U.S. PATENT DOCUMENTS

| | | | | |
|---|---|---|---|---|
| 2005/0195110 | A1* | 9/2005 | Lin | H01Q 9/0414 343/700 MS |
| 2011/0187602 | A1 | 8/2011 | Nair et al. | |
| 2014/0035097 | A1* | 2/2014 | Lin | H01L 23/66 257/531 |
| 2014/0145883 | A1* | 5/2014 | Baks | H01Q 1/2283 343/700 MS |
| 2014/0151860 | A1* | 6/2014 | Nakamura | H01L 23/66 257/664 |
| 2014/0266947 | A1 | 9/2014 | Chen et al. | |
| 2015/0325925 | A1* | 11/2015 | Kamgaing | H01L 21/52 343/893 |
| 2018/0342788 | A1* | 11/2018 | Lasiter | H01L 23/66 |
| 2019/0333882 | A1* | 10/2019 | Kamgaing | H01Q 19/005 |
| 2019/0393172 | A1* | 12/2019 | Pietambaram | H01L 23/66 |
| 2020/0185299 | A1* | 6/2020 | Chang | H01L 24/19 |
| 2020/0279829 | A1* | 9/2020 | Elsherbini | H01Q 1/2283 |
| 2020/0412021 | A1* | 12/2020 | Chang | H01Q 21/065 |
| 2021/0111478 | A1* | 4/2021 | Kim | H01Q 21/24 |

FOREIGN PATENT DOCUMENTS

| | | | |
|---|---|---|---|
| CN | 103650234 | A | 3/2014 |
| CN | 203910968 | U | 10/2014 |
| CN | 105375105 | A | 3/2016 |
| CN | 102712520 | B | 6/2016 |
| CN | 105990648 | A | 10/2016 |
| EP | 2626952 | A1 | 8/2013 |
| JP | 2000091717 | A | 3/2000 |
| JP | 2003264424 | A | 9/2003 |
| JP | 2008011169 | A | 1/2008 |

* cited by examiner

ANTENNA AND COMMUNICATIONS APPARATUS

CROSS-REFERENCE TO RELATED APPLICATIONS

This application is a continuation of International Patent Application No. PCT/CN2018/120156 filed on Dec. 10, 2018, which claims priority to Chinese Patent Application No. 201810213756.2 filed on Mar. 15, 2018. The disclosures of the aforementioned applications are hereby incorporated by reference in their entireties.

TECHNICAL FIELD

This application relates to the field of mobile communications technologies, and in particular, to an antenna and a communications apparatus.

BACKGROUND

With the advent of high-speed communication eras such as $5^{th}$ generation (5G) and virtual reality (VR), millimeter-wave communication gradually becomes a mainstream, and there are growing design and application requirements of a millimeter-wave antenna. Because a length of a transmission path of a millimeter-wave band has great impact on a signal amplitude loss, a conventional architecture of a radio frequency processing chip integrated circuit (IC)+a mainboard printed circuit board (PCB)+an antenna gradually cannot meet a high performance requirement. A wavelength of the millimeter-wave band is very short, and electrical performance of the millimeter-wave band is highly sensitive to a machining error. An antenna using the millimeter-wave band has a high requirement on technique precision. If manufacturing precision is poor, an impedance mismatch may occur, causing signal reflection. A conventional PCB processing technique cannot meet a requirement on millimeter-wave processing precision, and an impedance mismatch easily occurs, causing a relatively high signal loss on the transmission path of the millimeter-wave band.

An antenna-in-package (AiP) technology gradually becomes a mainstream antenna technology in 5G and millimeter-wave high-speed communications systems, and has broad application and market prospects. The AiP technology uses an IC+antenna in package architecture. In the AiP architecture, an antenna feeder path is very short. This can maximize equivalent isotropic radiated power (EIRP) of a wireless system and facilitate wider coverage.

However, in the current AiP technology, due to a limitation of an existing packaging and machining technique, an antenna in package in the current AiP technology has a large thickness and a large quantity of film layers. As a result, the antenna in package cannot meet a requirement for high performance of a millimeter-wave band antenna.

SUMMARY

Embodiments of this application provide an antenna and a communications apparatus. A substrate stacked structure of the antenna is redesigned such that an organic material with a low dielectric constant and a low dielectric loss is applicable to chip packaging. This overcomes a current technical defect that a low dielectric material is not applicable to chip packaging due to a severe mismatch between a coefficient of thermal expansion of the low dielectric material and a coefficient of thermal expansion of an organic resin package substrate of a radio frequency processing chip, and helps reduce a quantity of layers and a total thickness of organic substrates between surface radiating patches and inner radiating patches, to meet a requirement for installing a millimeter-wave antenna in narrow space and a requirement for high performance of the millimeter-wave band antenna.

An embodiment of this application provides an antenna, including surface radiating patches, inner radiating patches, a first dielectric substrate disposed between the surface radiating patches and the inner radiating patches, and a second dielectric substrate that is not disposed between the surface radiating patches and the inner radiating patches and on which the first dielectric substrate is stacked, where the second dielectric substrate is configured to carry antenna feeders connected to the inner radiating patches. A dielectric constant or dielectric loss of the first dielectric substrate is lower than that of an organic resin substrate, and a coefficient of thermal expansion of the second dielectric substrate is lower than that of the organic resin substrate. The first dielectric substrate with a low dielectric constant is disposed between the surface radiating patches and the inner radiating patches, and the dielectric constant or dielectric loss of the first dielectric substrate is lower than that of a chip package substrate (a conventional chip package substrate, for example, a mainboard in a terminal, is an organic resin substrate). This helps reduce a total thickness of the substrate between the surface radiating patches and the inner radiating patches, to meet a requirement for installing a millimeter-wave antenna in narrow space, and helps maintain high performance of the millimeter-wave antenna. Because a coefficient of thermal expansion of a low dielectric material is higher than that of the organic resin substrate, when the antenna is integrated on the chip package substrate, the chip package substrate is easily destabilized. In this application, the second dielectric substrate whose coefficient of thermal expansion is lower than that of the organic resin substrate is disposed, and an overall coefficient of thermal expansion of the antenna is decreased to match a coefficient of thermal expansion of the organic resin substrate such that the low dielectric material is applicable to chip packaging. Further, when the antenna uses the low dielectric material, the millimeter-wave antenna can be integrated on the chip package substrate.

Because a dielectric constant of a material of the substrate between the surface radiating patches and the inner radiating patches has relatively significant impact on a radio frequency signal, material selection for the substrate between the surface radiating patches and the inner radiating patches may focus more on a low dielectric constant. However, impact of a dielectric constant of a material of a substrate below the inner radiating patches on the radio frequency signal is far less than that of the material of the substrate between the surface radiating patches and the inner radiating patches. Therefore, a low dielectric constant may not be focused on. If the material of the substrate between the surface radiating patches and the inner radiating patches is a low dielectric constant material, to avoid a mismatch caused by an excessively high coefficient of thermal expansion of the low dielectric constant material, material selection for a substrate that is not between the surface radiating patches and the inner radiating patches may focus more on a coefficient of thermal expansion.

In a possible design, the dielectric constant of the first dielectric substrate is lower than 3.6.

In a possible design, the coefficient of thermal expansion of the second dielectric substrate is 0.7-10 parts-per-million (PPM)/degrees Celsius (° C.).

In a possible design, a material of the first dielectric substrate is polytetrafluoroethylene (PTFE) or a PTFE composite material including fiberglass cloth, and a dielectric constant of the material of the first dielectric substrate is 2-2.5.

In a possible design, a material of the second dielectric substrate is a bismaleimide triazine (BT) resin substrate material, or a glass epoxy multilayer material with a high glass transition temperature.

In a possible design, to meet a thickness requirement of a dielectric between the surface radiating patches and the inner radiating patches, space between the surface radiating patches and the inner radiating patches is further filled with an adhesive layer or at least one layer of organic resin substrate. For example, an adhesive layer may be added between the first dielectric substrate and the inner radiating patches. For another example, one or more layers of organic resin substrates are added between the surface radiating patches and the first dielectric substrate. For still another example, one or more layers of organic resin substrates may be added between the first dielectric substrate and the inner radiating patches.

In a possible design, to meet a dielectric thickness requirement of the substrate that is not between the surface radiating patches and the inner radiating patches, space between the inner radiating patches and the second dielectric substrate is further filled with at least one layer of organic resin substrate configured to carry the antenna feeders.

In a possible design, at least one layer of organic resin substrate is further disposed outside the second dielectric substrate, and is configured to carry the antenna feeders, where the outside of the second dielectric substrate refers to a side that is of the second dielectric substrate and that is away from the first dielectric substrate.

In a possible design, the surface radiating patches are arranged in an N×N array on the first dielectric substrate, and the inner radiating patches are distributed in an N×N array on the second dielectric substrate, where N is a positive integer greater than 1. In addition, the surface radiating patches and the inner radiating patches overlap in a direction perpendicular to the first dielectric substrate.

In a possible design, the organic resin substrate is further configured to carry a shield layer and a ground layer, and the shield layer and the ground layer are alternately disposed.

According to a second aspect, an embodiment of this application provides a communications apparatus, including a processor, a transceiver, and a memory, and further including the antenna according to any one of the first aspect or the possible designs of the first aspect. The processor, the transceiver, and the memory are connected through a bus. There are one or more transceivers. The transceiver includes a receiver and a transmitter, and the receiver and the transmitter are electrically connected to the antenna.

DESCRIPTION OF EMBODIMENTS

The following describes the technical solutions in the embodiments of this application with reference to the accompanying drawings in the embodiments of this application. A specific operation method in method embodiments may also be applied to an apparatus embodiment or a system embodiment. In the descriptions of this application, unless otherwise stated, "a plurality of" means two or more.

Figure 1:
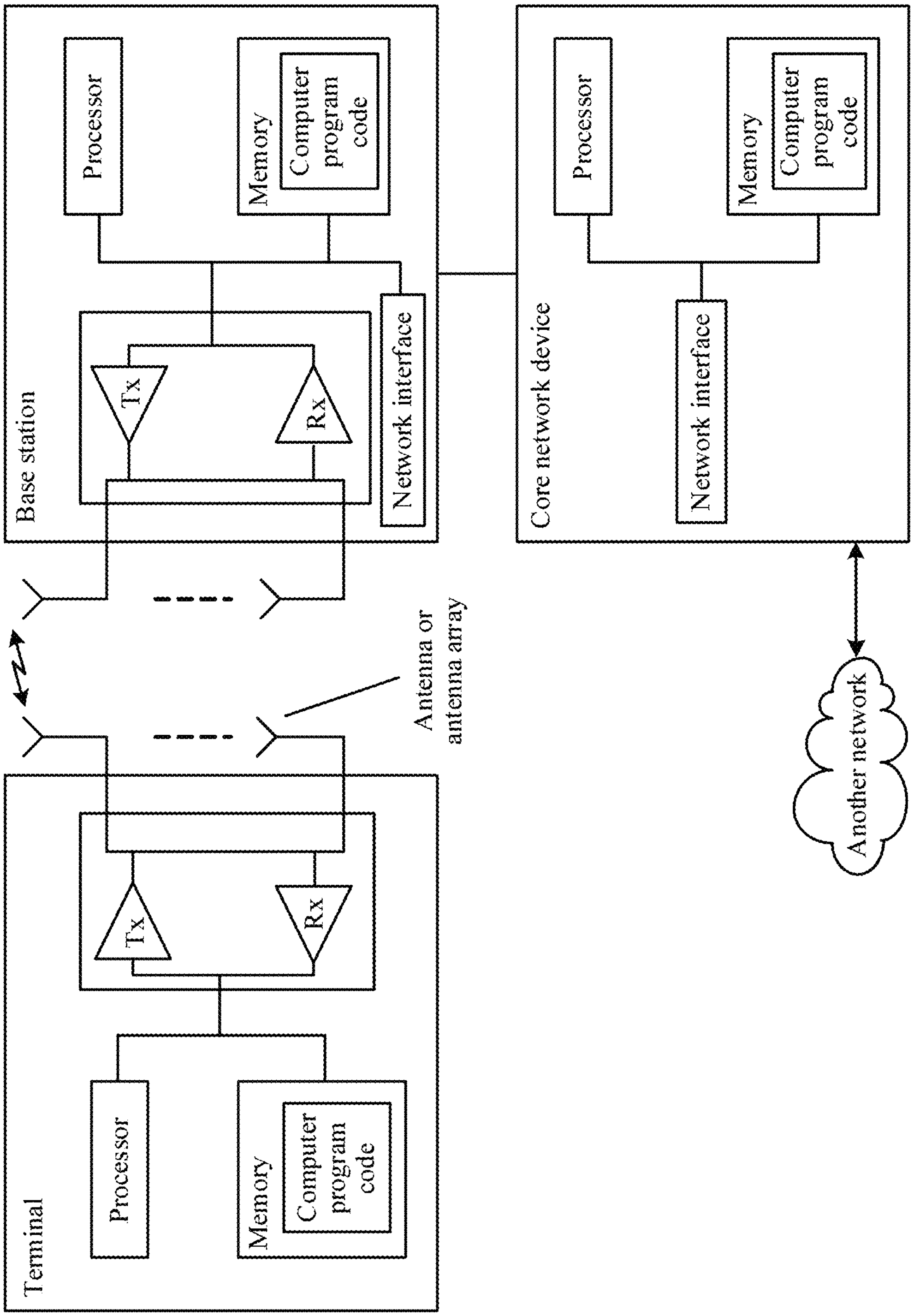
FIG. 1 is a schematic diagram of a possible architecture of a system according to an embodiment of this application.

For an architecture of a system provided in the embodiments, refer to FIG. 1. The system includes a terminal, a base station, and a core network device. The terminal performs wireless communication with the base station through a link.

The terminal includes one or more processors, one or more memories, and one or more transceivers that are connected through a bus. The one or more transceivers are connected to an antenna or antenna array. Each transceiver includes a transmitter Tx and a receiver Rx. The one or more memories include computer program code.

The base station provides wireless access for the terminal to the network, and includes one or more processors, one or more memories, one or more network interfaces, and one or more transceivers (each transceiver includes a receiver Rx and a transmitter Tx) that are connected through a bus. The one or more transceivers are connected to an antenna or antenna array. The one or more processors include computer program code. The network interface is connected to a core network through a link (for example, a link between the network interface and the core network), or is connected to another base station through a wired or wireless link.

The network may further include the core network device, such as a network control unit (NCE), a mobility management entity (MME), or a serving gateway (SGW). The core network device may provide a further connection to a network, such as a telephone network and/or a data communications network (for example, the Internet). The base station may be connected to the core network device through a link (for example, an S1 interface). The core network device includes one or more processors, one or more memories, and one or more network interfaces that are connected through a bus. The one or more memories include computer program code.

The memories included in the terminal, the base station, and the core network device may be of a type suitable for any local technology environment, and may be implemented using any suitable data storage technology.

A meaning of the antenna described below in the embodiments of this application covers the antenna or antenna array in the system shown in FIG. 1. The antenna described below in the embodiments of this application may be applied to the terminal and the base station in the system shown in FIG. 1.

It should be noted that the terms "system" and "network" may be used interchangeably in the embodiments of the present disclosure. "A plurality of" means two or more. In view of this, "a physical of" may also be understood as "at least two" in the embodiments of the present disclosure. The term "and/or" is an association relationship for describing associated objects and represents that three relationships may exist. For example, A and/or B may represent the following three cases: only A exists, both A and B exist, and only B exists. In addition, the character "/" generally indicates an "or" relationship between the associated objects.

Figure 2:
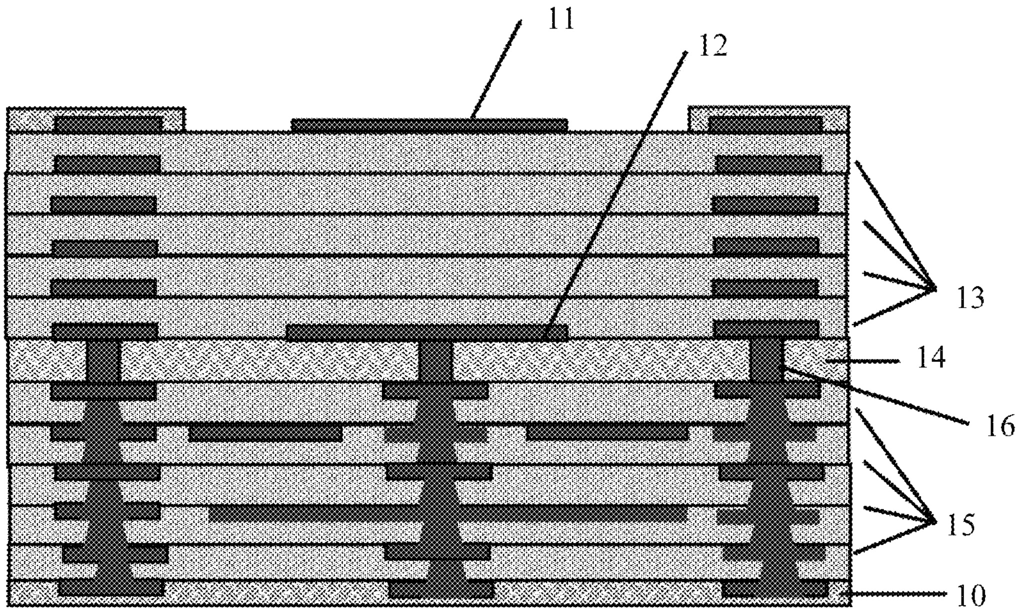
FIG. 2 is a sectional view of a packaging structure of an antenna according to an embodiment of this application.

FIG. 2 shows an example of an antenna. The antenna is obtained by packaging metal radiating patches, antenna feeders, and other signal transmission lines in a plurality of layers of organic substrates. The metal radiating patches include surface radiating patches 11 and inner radiating patches 12. To meet a performance requirement of an antenna frequency band, a specific distance needs to be kept between the surface radiating patches 11 and the inner radiating patches 12. The distance between the surface radiating patches 11 and the inner radiating patches 12 is a distance between the surface radiating patches 11 and the inner radiating patches 12 in a direction perpendicular to an organic dielectric. As shown in FIG. 2, the plurality of layers of organic substrates include an organic substrate 13 carrying the surface radiating patches 11, an organic substrate 14 carrying the inner radiating patches 12, and an organic substrate 15 carrying the antenna feeders. There are five layers of organic substrates 13 between the surface radiating patches 11 and the inner radiating patches 12, and five layers of organic substrates 15 carrying the antenna feeders. Materials of the organic substrate 13, the organic substrate 14, and the organic substrate 15 are organic resin used for conventional packaging. Disposing the five layers of organic substrates between the surface radiating patches 11 and the inner radiating patches 12 is to increase the distance between the surface radiating patches 11 and the inner radiating patches 12, to meet the performance requirement of the antenna frequency band.

The distance between the surface radiating patches and the inner radiating patches is related to the antenna frequency band and a dielectric constant of the organic substrate (five dielectric layers in FIG. 2) between the surface radiating patches and the inner radiating patches. If the antenna frequency band uses a millimeter-wave band, a specific distance needs to be kept between the surface radiating patches and the inner radiating patches in a vertical direction to meet a performance requirement of a specific frequency band. Further, a lower antenna frequency indicates that a larger distance between the surface radiating patches and the inner radiating patches is required, and a higher antenna frequency indicates that a smaller distance between the surface radiating patches and the inner radiating patches is required. A lower dielectric constant indicates that a smaller distance between the surface radiating patches and the inner radiating patches is required, and a larger dielectric constant indicates that a larger distance between the surface radiating patches and the inner radiating patches is required.

Because the organic substrate between the surface radiating patches and the inner radiating patches is usually made of organic resin used for conventional packaging, the dielectric constant of the organic substrate is usually higher than 3.6. When the antenna frequency band uses a $4^{th}$ generation (4G) frequency band, for example, 1.8-2.7 gigahertz (GHz), a total board thickness of the antenna shown in FIG. 2 needs to be very large, and it may be difficult for this technique to meet a requirement on the total board thickness of the antenna. When a thickness between the surface radiating patches and the inner radiating patches cannot meet a specific thickness requirement, signal transmission performance of the antenna deteriorates. Hence, the reason it is difficult to integrate a low-frequency antenna on a chip package substrate.

When the antenna frequency band uses a high frequency band, for example, a millimeter-wave band of 26.5-29.5 GHz, theoretically, a smaller distance between the surface radiating patches 11 and the inner radiating patches 12 of the antenna shown in FIG. 2 is desirable. However, due to impact of a high dielectric constant of a packaging material used in a conventional packaging technique, the distance between the surface radiating patches 11 and the inner radiating patches 12 is still very large. For example, the antenna frequency band is 28 GHz. Due to a relatively high dielectric constant of a package substrate used for conventional packaging, the distance between the surface radiating patches and the inner radiating patches is at least 400 micrometers (μm). Therefore, a thickness of each layer of organic substrate between the surface radiating patches 11 and the inner radiating patches 12 needs to be at least 80 μm. However, an excessively large thickness of the organic substrate increases difficulty in machining the organic substrate, for example, causes difficulty in machining a blind hole between the organic substrates, or even causes the total board thickness of the antenna to be beyond a board thickness production capability of a general CSP product production line. In addition, a larger quantity of layers of organic substrates between the surface radiating patches and the inner radiating patches leads to a longer processing technique process, a longer period, and higher costs. Therefore, in terms of costs and constraint conditions of the processing technique, it is difficult for the processing technique to meet a small thickness requirement of the total board thickness of the high-band antenna. When a thickness between the surface radiating patches and the inner radiating patches cannot meet the small thickness requirement, signal transmission performance of the high-band antenna deteriorates.

To address the foregoing problem, this application further provides an antenna. A substrate stacked structure of the antenna is redesigned to reduce a quantity of layers and a total thickness of organic substrates between surface radiating patches and inner radiating patches without increasing processing difficulty and processing costs of the organic substrates. This meets a requirement for installing a millimeter-wave antenna in narrow space, implements packaging of the antenna on a chip package substrate, and meets a requirement for high performance of the millimeter-wave band antenna.

Figure 3:
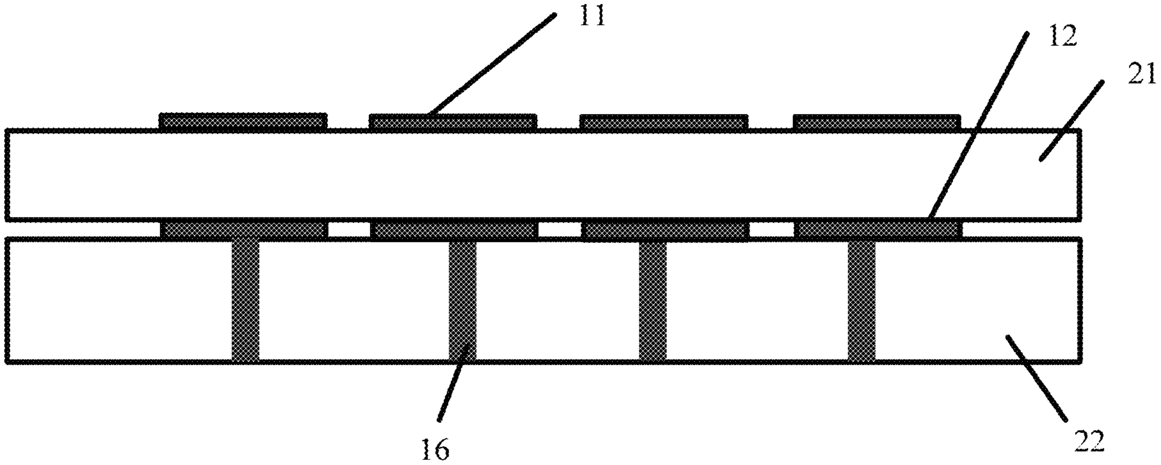
FIG. 3 is a sectional view of a main structure of another antenna according to an embodiment of this application.

As shown in FIG. 3, an antenna provided in this application includes surface radiating patches 11, inner radiating patches 12, a first dielectric substrate 21 disposed between the surface radiating patches 11 and the inner radiating patches 12, and a second dielectric substrate 22 that is not disposed between the surface radiating patches 11 and the inner radiating patches 12 and on which the first dielectric substrate 21 is stacked. The second dielectric substrate 22 is configured to carry antenna feeders 16 connected to the inner radiating patches 12. A dielectric constant or dielectric loss of the first dielectric substrate 21 is lower than that of an organic resin substrate, and a coefficient of thermal expansion of the second dielectric substrate 22 is lower than that of the organic resin substrate.

In this application, the first dielectric substrate 21 with a low dielectric constant is disposed between the surface radiating patches 11 and the inner radiating patches 12, and the dielectric constant or dielectric loss of the first dielectric substrate 21 is lower than that of a chip package substrate (for example, a mainboard in a terminal), where a conventional chip package substrate is an organic resin substrate. This helps reduce a total thickness of the substrate between the surface radiating patches 11 and the inner radiating patches 12, to meet a requirement for installing a millimeter-wave antenna in narrow space, and helps maintain high performance of the millimeter-wave antenna. Because a coefficient of thermal expansion of a low dielectric material is higher than that of the organic resin substrate, when the antenna is integrated on the chip package substrate, the chip package substrate is easily destabilized. In this application, the second dielectric substrate 22 whose coefficient of thermal expansion is lower than that of the organic resin substrate is disposed, and an overall coefficient of thermal expansion of the antenna is decreased to match a coefficient of thermal expansion of the organic resin substrate such that the low dielectric material is applicable to chip packaging. Further, when the antenna uses the low dielectric material, the millimeter-wave antenna can be integrated on the chip package substrate.

In a possible design, at least one layer of organic resin substrate is further disposed outside the second dielectric substrate 22, and is configured to carry the antenna feeders 16. For ease of description, the at least one layer of organic resin substrate is referred to as a third dielectric substrate 23.

In a possible design, space between the surface radiating patches 11 and the inner radiating patches 12 is further filled with an adhesive layer.

Figure 4A:
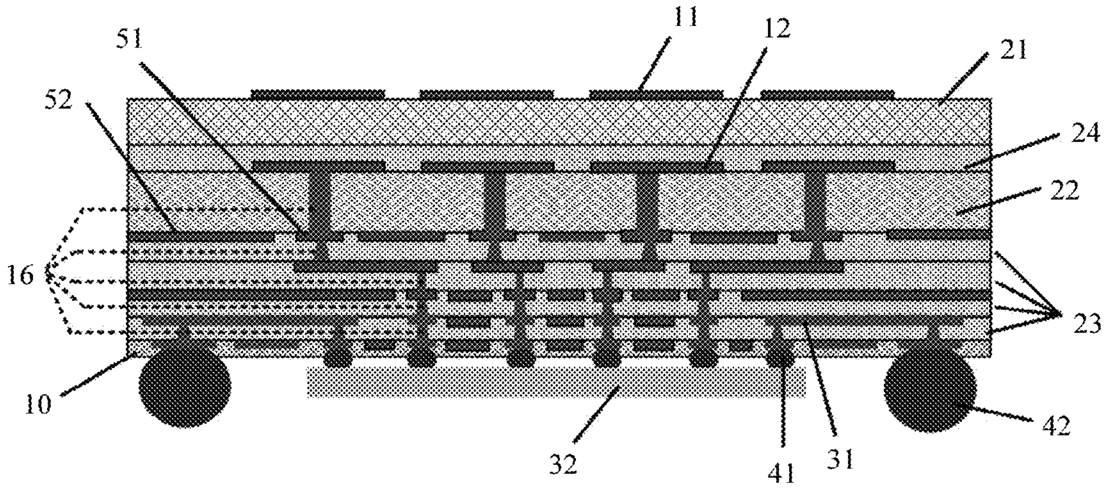
FIG. 4A is a sectional view of a packaging structure of an antenna according to an embodiment of this application.

An antenna provided in this application is a stacked structure. FIG. 4A may show an example of the stacked structure of the antenna. The antenna mainly includes a substrate 10, a first dielectric substrate 21, a second dielectric substrate 22, and a third dielectric substrate 23 that are stacked on the substrate 10, surface radiating patches 11, inner radiating patches 12, and antenna feeders 16, where the inner radiating patches 12 are electrically connected to the antenna feeders 16, and the antenna feeders 16 are carried in the second dielectric substrate 22 and the third dielectric substrate 23. The first dielectric substrate 21 is stacked on the second dielectric substrate 22, and the first dielectric substrate 21 is configured to carry the surface radiating patches 11. The second dielectric substrate 22 is stacked on the third dielectric substrate 23, a surface that is of the second dielectric substrate 22 and that faces the first dielectric substrate 21 is used to carry the inner radiating patches 12, and the second dielectric substrate 22 is further configured to carry one part of the antenna feeders 16. The third dielectric substrate 23 is stacked on the substrate 10, includes a plurality of organic layers, and is configured to carry the other part of the antenna feeders 16. A material of the third dielectric substrate 23 is organic resin. A dielectric constant of a material of the first dielectric substrate 21 is lower than that of the third dielectric substrate 23, and a coefficient of thermal expansion of the second dielectric substrate 22 is lower than that of the third dielectric substrate 23. An adhesive layer 24 is further disposed between the first dielectric substrate 21 and the second dielectric substrate 22, and is configured to bond the first dielectric substrate 21 and the second dielectric substrate 22, where the adhesive layer 24 covers the inner radiating patches 12 carried on the second dielectric substrate 22.

For the antenna shown in FIG. 4A, impact of a dielectric constant of the adhesive layer 24 on a total board thickness of the organic substrate between the surface radiating patches 11 and the inner radiating patches 12 is far less than that of the first dielectric substrate 21. Theoretically, a lower dielectric constant or dielectric loss of a material of the adhesive layer 24 is desirable. The adhesive layer 24 may be a prepreg, for example, a conventional organic resin material. The first dielectric substrate 21 may be pressed and pasted on the second dielectric substrate 22 through the prepreg using a lamination technique.

In a possible design, based on a thickness requirement of a dielectric between the surface radiating patches 11 and the inner radiating patches 12, space between the surface radiating patches 11 and the inner radiating patches 12 may be further filled with at least one layer of organic resin substrate.

In a possible design, space between the inner radiating patches and the second dielectric substrate 22 is further filled with at least one layer of organic resin substrate configured to carry the antenna feeders.

Figure 4B:
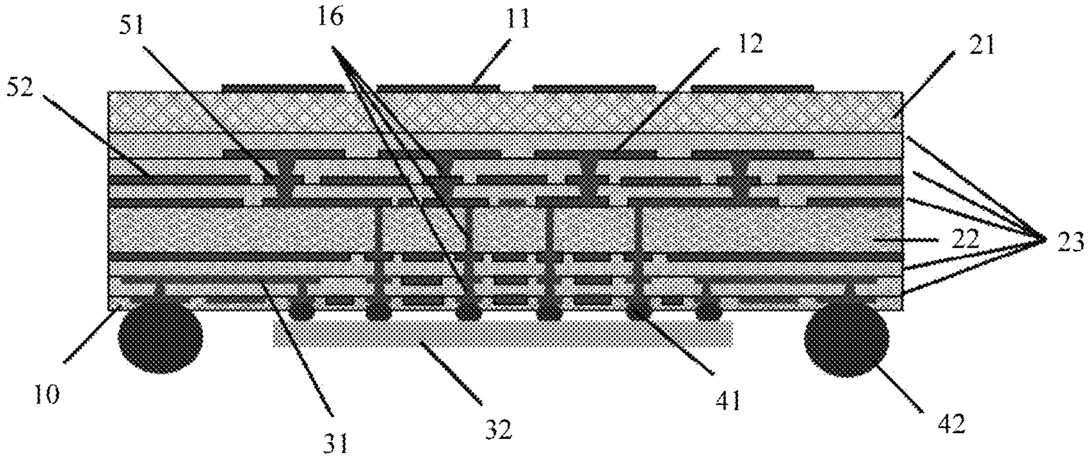
FIG. 4B is a sectional view of a packaging structure of an antenna according to an embodiment of this application.

Referring to FIG. 4B, another antenna provided in this application may be used as another example of a stacked structure of the antenna, and mainly includes a substrate 10, and a first dielectric substrate 21, a second dielectric substrate 22, and a third dielectric substrate 23 that are stacked on the substrate 10, and further includes surface radiating patches 11, inner radiating patches 12, and antenna feeders 16. The inner radiating patches 12 are electrically connected to the antenna feeders 16, and the antenna feeders 16 are carried in the second dielectric substrate 22 and the third dielectric substrate 23. The first dielectric substrate 21 is stacked on the third dielectric substrate 23, and the first dielectric substrate 21 is configured to carry the surface radiating patches 11. The third dielectric substrate 23 is stacked on the substrate 10, and includes a plurality of organic layers, where a surface organic layer is configured to carry the inner radiating patches 12, and the other organic layers are configured to carry one part of the antenna feeders 16. The second dielectric substrate 22 is stacked between any two organic layers of the third dielectric substrate 23, and is configured to carry the other part of the antenna feeders 16. FIG. 4 provides an example in which the second dielectric substrate 22 is located between two organic layers of the third dielectric substrate 23, and the second dielectric substrate 22 is disposed between the third organic layer and the fourth organic layer of the third dielectric substrate 23. A dielectric constant of the first dielectric substrate 21 is lower than that of the second dielectric substrate 22 and that of the third dielectric substrate 23, and a coefficient of thermal expansion of the second dielectric substrate 22 is lower than that of the first dielectric substrate 21 and that of the third dielectric substrate 23.

The foregoing two antennas shown in FIG. 4A and FIG. 4B each mainly include the first dielectric substrate 21, the second dielectric substrate 22, and the third dielectric substrate 23. A similarity between the foregoing two antennas lies in that a stacked layer between the surface radiating patches 11 and the inner radiating patches 12 includes the first dielectric substrate 21 with a low dielectric constant, and a stacked layer below the inner radiating patches 12 includes the second dielectric substrate 22 with a low coefficient of thermal expansion. A difference between the foregoing two antennas lies only in that locations of the second dielectric substrate 22, with the low coefficient of thermal expansion, relative to the third dielectric substrate 23 are different.

It should be specially noted that, in the foregoing two antennas in the examples of this application, the first dielectric substrate 21 uses a low dielectric material, but has a higher coefficient of thermal expansion than the organic resin substrate, and the second dielectric substrate 22 uses a low thermal expansion material, and has a lower coefficient of thermal expansion than the organic resin substrate. In this stacked structure design, an overall coefficient of thermal expansion of all dielectric substrates in the stacked structure of the antenna can be decreased to match a coefficient of thermal expansion of a chip package substrate (whose material is usually organic resin). This addresses a severe mismatch, between a coefficient of thermal expansion of the stacked layer and the coefficient of thermal expansion of the chip package substrate, that occurs when the stacked layer between the surface radiating patches 11 and the inner radiating patches 12 uses a low dielectric material such that the low dielectric material is applicable to chip packaging. On this basis, the first dielectric substrate 21 between the surface radiating patches 11 and the inner radiating patches 12 uses a low dielectric material. This helps reduce a total thickness of the substrate between the surface radiating patches 11 and the inner radiating patches 12, to meet a requirement for installing a millimeter-wave antenna in narrow space, implement packaging of the antenna on the chip package substrate, and meet a requirement for high performance of the millimeter-wave band antenna.

The stacked layer designs of the foregoing two antennas reduce a quantity of layers and a total thickness of organic substrates between the surface radiating patches 11 and the inner radiating patches 12, and also help shorten a processing technique process of an entire package substrate, shorten a processing period of the substrate, and reduce costs.

Figure 5:
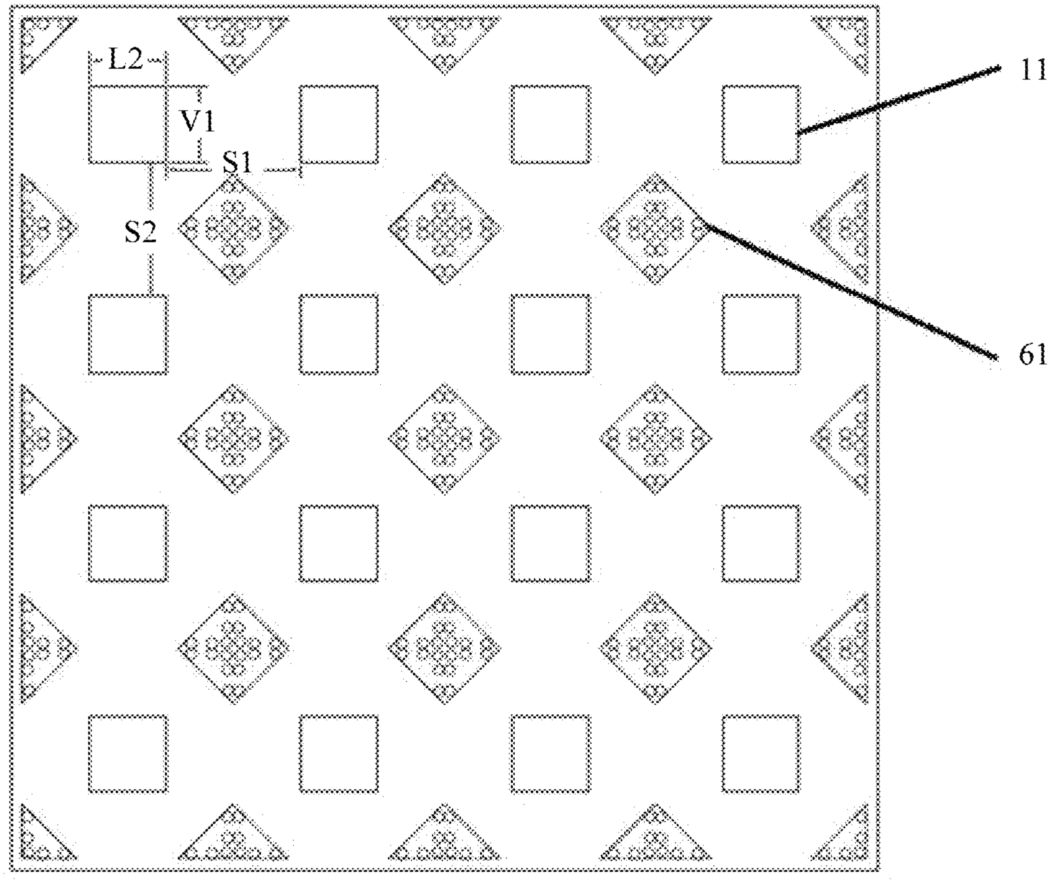
FIG. 5 is a top view of a packaging structure of an antenna according to an embodiment of this application.

In this application, the inner radiating patches 12 are main radiating patches, and are configured to radiate and receive an electromagnetic wave signal. The surface radiating patches 11 are parasitic radiating patches, and have a function of increasing antenna bandwidth. The surface radiating patches 11 are arranged in an N×N array on the first dielectric substrate 21, and the inner radiating patches 12 are distributed in an N×N array on the second dielectric substrate 22, where N is a positive integer greater than 1. As shown in FIG. 5, the surface radiating patches 11 are arranged in a 4×4 array. The surface radiating patches 11 and the inner radiating patches 12 are arranged in a stacked manner, and the surface radiating patches 11 and the inner radiating patches 12 overlap in a direction perpendicular to the first dielectric substrate 21. In the accompanying drawings in the embodiments of the present disclosure, it appears that projections of the surface radiating patch 11 and the inner radiating patch 12 in the direction perpendicular to the first dielectric substrate 21 completely overlap. However, in an actual product, the overlapping setting may include partial overlapping. To be specific, the projections of the surface radiating patch 11 and the inner radiating patch 12 in the direction perpendicular to the first dielectric substrate 21 partially overlap, or for the projections of the surface radiating patch 11 and the inner radiating patch 12 in the direction perpendicular to the first dielectric substrate 21, a projection of one radiating patch is completely within a projection of another radiating patch.

A material of the substrate between the two layers of radiating patches is a low dielectric material, and has a lowest dielectric constant and dielectric loss in materials of substrates of the entire stacked structure. This helps reduce a distance between the surface radiating patches 11 and the inner radiating patches 12. Therefore, the stacked structure of the radiating patches of the antenna and the low dielectric material of the stacked layer between the radiating patches of the antenna bring about high bandwidth and high gain of the stacked structure of the antenna. Optionally, as shown in FIG. 5, suspended copper sheets or ground copper sheets 61 are disposed around the surface radiating patches 11. This can improve coplanarity and a copper routing rate of the entire substrate.

Because a dielectric constant of the material of the substrate between the surface radiating patches 11 and the inner radiating patches 12 has relatively significant impact on a radio frequency signal, in this application, material selection for the first dielectric substrate 21 between the surface radiating patches 11 and the inner radiating patches 12 may focus more on a low dielectric constant. Because impact of a dielectric constant of a material of a substrate that is not between the surface radiating patches 11 and the inner radiating patches 12 on the radio frequency signal is far less than that of the material of the substrate between the surface radiating patches 11 and the inner radiating patches 12, the material of the substrate that is not between the surface radiating patches 11 and the inner radiating patches 12 may not necessarily be a low dielectric constant material. To match the coefficient of thermal expansion of the chip package substrate, when the material of the first dielectric substrate 21 between the surface radiating patches 11 and the inner radiating patches 12 is a low dielectric material, and a coefficient of thermal expansion of the first dielectric substrate 21 is far higher than that of the chip package substrate, material selection for the second dielectric substrate 22 that is not between the surface radiating patches 11 and the inner radiating patches 12 may focus more on a coefficient of thermal expansion.

In a possible design, the dielectric constant of the first dielectric substrate 21 is lower than 3.6, and a dielectric constant of the second dielectric substrate 22 is usually 3.6-4.8.

For example, the material of the first dielectric substrate 21 is PTFE or a PTFE composite material including fiberglass cloth.

The dielectric constant of the material of the first dielectric substrate is 2-2.5. PTFE has a very low dielectric constant and dielectric loss in a relatively wide frequency range, and relatively high breakdown voltage, volume resistivity, and arc resistance. To meet a performance requirement of the antenna, when a PTFE material of a specific thickness is used as a dielectric material between the surface radiating patches 11 and the inner radiating patches 12, the distance between the surface radiating patches 11 and the inner radiating patches 12 may be reduced to 100-300 μm.

Usually, during antenna manufacturing, PTFE is not selected as a material for the organic substrate between the surface radiating patches 11 and the inner radiating patches 12 to reduce the total board thickness of the organic substrate between the surface radiating patches 11 and the inner radiating patches 12. A reason is as follows. A dielectric constant of PTFE is approximately 2.17, and if PTFE is used as the material of the organic substrate, theoretically, the distance between the surface radiating patches 11 and the inner radiating patches 12 can be reduced. However, a coefficient of thermal expansion (CTE) of PTFE is usually higher than 20 PPM/° C., and a CTE value of a radio frequency processing chip 32 (IC) is 3-4 PPM/° C. If the material of the organic substrate between the surface radiating patches 11 and the inner radiating patches 12 is PTFE, an overall CTE of an antenna package is greatly increased (which affects expansion in a non-thickness direction). Consequently, the IC is unstable. Under an effect of overall thermal expansion of the package, a connection pin of the IC may be unsoldered. This causes a component to be disconnected. Therefore, PTFE with a low dielectric constant is usually not used for chip packaging.

To address a current severe mismatch between a low dielectric material and the radio frequency processing chip 32 due to a coefficient of thermal expansion, in this application, a material of the second dielectric substrate 22 is a material with a low coefficient of thermal expansion, to support overall rigidity of all package substrates of a stacked structure of an array antenna and maintain a relatively low overall CTE of all the package substrates, to better match the radio frequency processing chip 32 and a simultaneous multithreading (SMT) motherboard (PCB). Further, the low dielectric material is applicable to chip packaging. This helps reduce the total thickness of the substrate between the surface radiating patches 11 and the inner radiating patches 12, to meet a requirement for high performance of a millimeter-wave band antenna.

In a possible design, a coefficient of thermal expansion of the material of the second dielectric substrate 22 is 0.7-10 PPM/° C.

For example, the material of the first dielectric substrate 21 is PTFE, and a coefficient of thermal expansion of the material of the first dielectric substrate 21 is at least approximately 20 PPM/° C. When the coefficient of thermal expansion of the material of the second dielectric substrate 22 is 0.7-10 PPM/° C., an overall coefficient of thermal expansion of the stacked structure of the antenna may be decreased to 4-8 PPM/° C. In addition, the coefficient of thermal expansion of the radio frequency processing chip 32 is 3-4 PPM/° C. This helps increase a degree of matching between the overall coefficient of thermal expansion of the stacked structure of the antenna and the coefficient of thermal expansion of the radio frequency processing chip 32.

In a possible design, the material of the second dielectric substrate 22 is a BT resin substrate material, or a glass epoxy multilayer material with a high glass transition temperature.

The BT resin substrate material is thermosetting resin formed by adding a modifying component such as epoxy resin, polyphenyl ether (PPE) resin, or allyl compound to main resin components including bismaleimide (BMI) and triazine, and is referred to as BT resin.

The glass epoxy multilayer material with the high glass transition temperature (Tg) is a halogen-free environment-friendly high Tg multilayer material with high elasticity and low thermal expansion. For the glass epoxy multilayer material, high elasticity can greatly reduce warpage of the substrate, and excellent punch processing performance can reduce technique costs. The glass epoxy multilayer material has no halogen-flame retardant, antimony, and red phosphorus, flame retardant performance of the glass epoxy multilayer material reaches a UL94V-0 level, and the glass epoxy multilayer material is an environmental-friendly material.

Optionally, the material of the second dielectric substrate 22 may be BT resin whose model is HL832NSF, where a coefficient of thermal expansion of the BT resin is 3 PPM/° C., or the material of the second dielectric substrate 22 may be BT resin of another model, where a coefficient of thermal expansion of the BT resin is 1-10 PPM/° C.

Optionally, the material of the second dielectric substrate 22 may be a high Tg glass epoxy multilayer material in an MCL-E-700G(R) series, where a coefficient of thermal expansion of the high Tg glass epoxy multilayer material is 0.7-3 PPM/° C.

For example, a coefficient of thermal expansion of a high Tg glass epoxy multilayer material whose model is MCL-E-705G(R) is 3.0-2.8 PPM/° C., a coefficient of thermal expansion of a high Tg glass epoxy multilayer material whose model is MCL-E-770G(R) is 1.8 PPM/° C., and a coefficient of thermal expansion of a high Tg glass epoxy multilayer material whose model is MCL-E-770G(R) is 0.7 PPM/° C.

The third dielectric substrate 23 is also a stacked structure, and a material of the third dielectric substrate 23 is an organic resin material used for conventional packaging, where a coefficient of thermal expansion of the material is 20 PPM/° C., and a dielectric constant of the material is higher than 3.6. In a possible design, the third dielectric substrate 23 includes M organic layers that are stacked, where M is a positive integer greater than 1. The third dielectric substrate 23 is a multilayer board structure, and an actual quantity of layers of organic resin substrates in the third dielectric substrate 23 may be adjusted based on a performance requirement of the antenna. For example, the third dielectric substrate 23 shown in FIG. 4A includes four layers of organic resin substrates.

In a possible design, the third dielectric substrate 23 is further configured to carry a ground layer 51 and a shield layer 52, where the shield layer 52 and the ground layer 51 are alternately disposed.

This application further provides a communications apparatus, including a processor, a transceiver, and a memory, and further including the antenna in the foregoing embodiments. The processor, the transceiver, and the memory are connected through a bus. There are one or more transceivers. The transceiver includes a receiver and a transmitter, and the receiver and the transmitter are connected to the antenna.

Optionally, the receiver and the transmitter may be integrated on a radio frequency processing chip. The radio frequency processing chip is configured to provide active excitation, and perform amplitude and phase adjustment on a radio frequency signal that is from the receiver or to be sent to the transmitter. In this case, as shown in FIG. 4A or FIG. 4B, a connection relationship between the radio frequency processing chip and the antenna is as follows. The antenna feeders 16 in the third dielectric substrate 23 are electrically connected to the radio frequency processing chip 32 through solder bumps 41. Signal transmission lines 31 are further carried in an organic layer that is of the third dielectric substrate 23 and that is close to the substrate. One end of the signal transmission line 31 is electrically connected to the solder bump 41 on the edge of the radio frequency processing chip 32, and the other end of the signal transmission line is electrically connected to the bus through a solder ball 42.

The antenna provided in the embodiments of this application is a stacked structure, and mainly includes the first dielectric substrate 21, the second dielectric substrate 22, and the third dielectric substrate 23. A stacked layer between the surface radiating patches and the inner radiating patches is mainly the first dielectric substrate 21, and stacked layers below the inner radiating patches are mainly the second dielectric substrate 22 and the third dielectric substrate 23. Based on the foregoing embodiments, the first dielectric substrate uses a low dielectric material, the second dielectric substrate uses a low thermal expansion material, and the third dielectric substrate uses related content of an organic resin substrate used for conventional chip packaging. This can greatly reduce a thickness of the stacked layer between the surface radiating patches and the inner radiating patches, and help meet a requirement for high performance of a millimeter-wave band antenna. Further, in the embodiments of this application, the first dielectric substrate 21 uses a low dielectric material, but has a relatively high coefficient of thermal expansion, the second dielectric substrate 22 uses a material with a low coefficient of thermal expansion, and the third dielectric substrate 23 uses a conventional organic resin material used for packaging. In this stacked structure design, the overall coefficient of thermal expansion of all the dielectric substrates of the stacked structure of the antenna may be decreased, to address a severe mismatch, between the coefficient of thermal expansion of the radio frequency processing chip and a coefficient of thermal expansion of the stacked layer between the surface radiating patches and the inner radiating patches, that occurs because the stacked layer uses a low dielectric material such that the low dielectric material is applicable to chip packaging. On this basis, the first dielectric substrate 21 between the surface radiating patches and the inner radiating patches uses a low dielectric material. This helps reduce a total thickness of the substrate between the surface radiating patches and the inner radiating patches, to meet a requirement for installing a millimeter-wave antenna in narrow space, implement packaging of the antenna on the chip package substrate, and meet a requirement for high performance of the millimeter-wave band antenna.

When the antenna shown in FIG. 4A or FIG. 4B in the embodiments of this application is applied to the communications apparatus, the antenna of the communications apparatus may transmit a radio signal on a high frequency band, for example, a millimeter-wave band of 26.5-29.5 GHz, and has relatively high application value in a 5G system.

The stacked layer design of the antenna in the embodiments of this application reduce a quantity of layers and a total thickness of organic substrates between the surface radiating patches and the inner radiating patches, and also help shorten a processing technique process of an entire package substrate of the antenna, shorten a processing period of the substrate, and reduce costs.

The communications apparatus may be a network device, including but not limited to a base station (for example, a NodeB, an evolved NodeB (eNodeB), a gNodeB in a 5G communications system, a base station or network device in a future communications system, an access node in a WI-FI system, a wireless relay node, or a wireless backhaul node) and the like. Alternatively, the communications apparatus may be a radio controller in a cloud radio access network (CRAN) scenario. Alternatively, the communications apparatus may be a network device on a 5G network or a network device on a future evolved network. Alternatively, the communications apparatus may be a wearable device, a vehicle-mounted device, or the like. Alternatively, the communications apparatus may be a small cell, a transmission node (transmission/reception point (TRP)), or the like. Definitely, this application is not limited thereto.

The communications apparatus may be a terminal. The terminal is a device having a wireless transceiver function. The terminal may be deployed on land, including an indoor or outdoor device, a handheld device, a wearable device, or a vehicle-mounted device, or may be deployed on the water (for example, a ship), or may be deployed in the air (for example, on an airplane, a balloon, or a satellite). The terminal may be a mobile phone, a tablet (e.g., IPAD), a computer having a wireless transceiver function, a VR terminal device, an augmented reality (AR) terminal device, a wireless terminal in industrial control, a wireless terminal in self driving, a wireless terminal in telemedicine (remote medical), a wireless terminal in a smart grid, a wireless terminal in transportation safety, a wireless terminal in a smart city, a wireless terminal in a smart home, or the like. An application scenario is not limited in the embodiments of this application. Sometimes, the terminal device may also be referred to as a user equipment (UE), an access terminal device, a UE unit, a UE station, a mobile station, a remote station, a remote terminal device, a mobile device, a UE terminal device, a terminal device, a wireless communications device, a UE agent, a UE apparatus, or the like.

For example, the communications apparatus in this application may be the terminal in the system shown in FIG. 1, or may be the base station in the system shown in FIG. 1.

Figure 6:
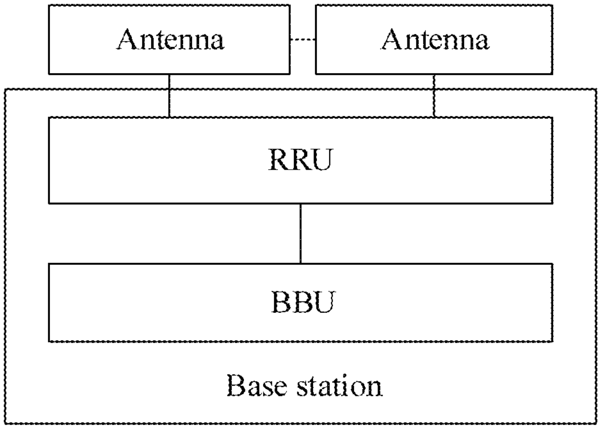
FIG. 6 is a schematic structural diagram of a base station according to an embodiment of this application.

For example, the communications apparatus in this application may be a base station (eNodeB) shown in FIG. 6, and the base station includes a BBU and an RRU. A receiver and a transmitter are disposed in the RRU. The RRU is connected to an antenna, where the antenna may be the antenna shown in FIG. 3 or FIG. 4 in the embodiments of this application.

Figure 7:
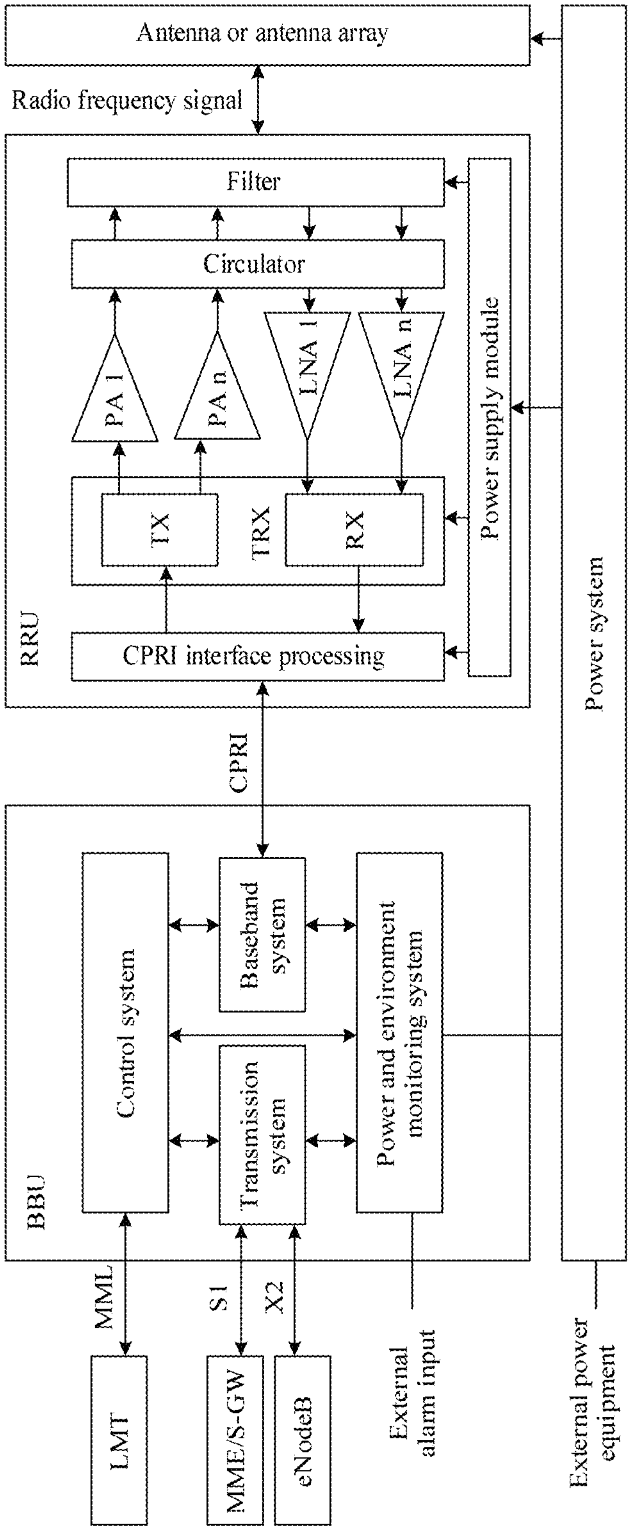
FIG. 7 is a schematic structural diagram of a baseband unit (BBU) and a remote radio unit (RRU) in a base station according to an embodiment of this application.

Specific structures of the BBU and the RRU may be further shown in FIG. 7, where the BBU and the RRU may be separately used as required. The RRU may be classified as a superheterodyne intermediate frequency RRU, a zero intermediate frequency RRU, and a software-defined radio (SDR) ideal intermediate frequency RRU. The superheterodyne intermediate frequency RRU uses a two-level spectrum shifting structure for signal modulation and demodulation, namely, a complex intermediate frequency structure (a so-called superheterodyne intermediate frequency structure), to complete one spectrum shifting on each of a digital intermediate frequency channel and a radio frequency channel. In the zero intermediate frequency RRU, one spectrum shifting is directly performed on a radio frequency channel. In the SDR ideal intermediate frequency RRU, spectrum shifting is directly completed on a digital intermediate frequency channel, and an analog-to-digital (AD)/digital-to-analog (DA) converter completely processes digital-to-analog conversion of a radio frequency signal.

Figure 8:
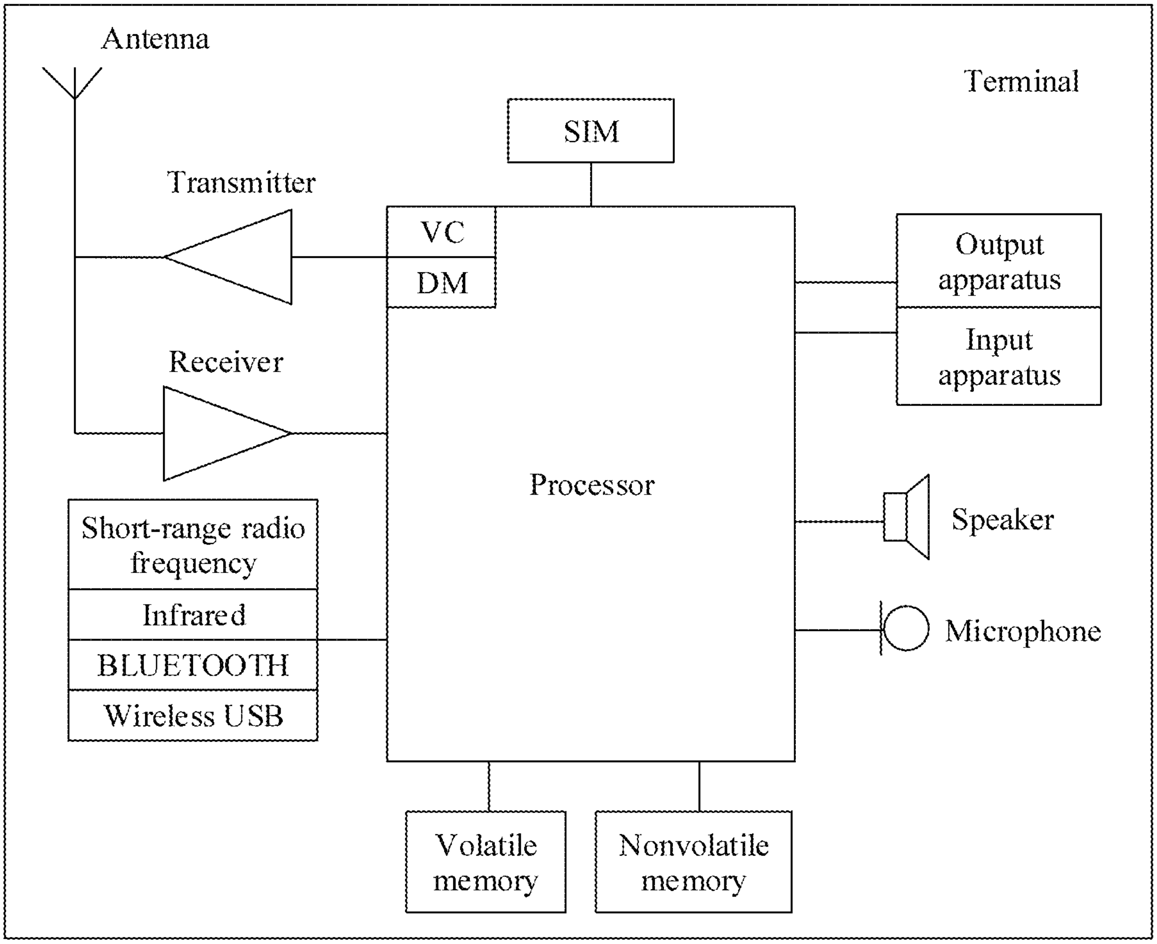
FIG. 8 is a schematic structural diagram of a terminal according to an embodiment of this application.

For example, the communications apparatus in this application may be a terminal device shown in FIG. 8. The terminal device includes an antenna, a transmitter, a receiver, a processor, a volatile memory, a nonvolatile memory, and the like. The antenna is connected to the transmitter and the receiver, and the antenna may be the antenna shown in FIG. 3 or FIG. 4 in the embodiments of this application. The transmitter, the receiver, the volatile memory, and the nonvolatile memory are connected to the processor.

The processor may include a circuit used for audio/video and logical functions of the terminal device. For example, the processor may include a digital signal processor device, a microprocessor device, an AD converter, a DA converter, and the like. Control and signal processing functions of a mobile device may be allocated to these devices based on capabilities of these devices. The processor may further include an internal voice coder (VC), an internal data modem (DM), and the like. In addition, the processor may include a function of operating one or more software programs. The software programs may be stored in a memory. Usually, the processor and a stored software instruction may be configured to enable the terminal device to perform an action. For example, the processor can operate a connection program.

The terminal shown in FIG. 8 may further include a user interface. The user interface may include, for example, a headset or speaker, a microphone, an output apparatus (for example, a display), and an input apparatus. The user interface is operably coupled to the processor. In this case, the processor may include a user interface circuit, and the user interface circuit is configured to control at least some functions of one or more elements (for example, the speaker, the microphone, and the display) of the user interface. The processor and/or the user interface circuit including the processor may be configured to control one or more functions of the one or more elements of the user interface using a computer program instruction (for example, software and/or firmware) stored in the memory accessible to the processor. Although not shown, the terminal device may include a battery configured to supply power to various circuits related to the mobile device. The circuit is, for example, a circuit that provides mechanical vibration as detectable output. The input apparatus may include a device, for example, a small keypad, a touch display, a joystick, and/or at least one other input device, that allows the apparatus to receive data.

The terminal shown in FIG. 8 may further include one or more connection circuit modules configured to share and/or obtain data. For example, the terminal device may include a short-range radio frequency (RF) transceiver and/or a detector, and therefore can share data with an electronic device and/or obtain data from the electronic device based on an RF technology. The terminal may include another short-range transceiver such as an infrared (IR) transceiver, a BLUETOOTH transceiver, or a wireless Universal Serial Bus (USB) transceiver. The BLUETOOTH transceiver can be operated based on a low-power or ultra-low-power BLUETOOTH technology. In this case, the terminal, more further, the short-range transceiver can send data to and/or receive data from an electronic device near the apparatus (for example, within 10 meters). Although not shown, the terminal device can send data to and/or receive data from the electronic device based on various wireless networking technologies, and these technologies include WI-FI, WI-FI low power consumption, and wireless local area network (WLAN) technologies, for example, the Institute of Electrical and Electronics Engineers (IEEE) 802.11 technology, an IEEE 802.15 technology, and an IEEE 802.16 technology.

The terminal shown in FIG. 8 may further include a memory that can store an information element related to a mobile user, such as a subscriber identity module (SIM). In addition to the SIM, the apparatus may further include another removable and/or fixed memory. The terminal device may include a volatile memory and/or a nonvolatile memory. For example, the volatile memory may include a random-access memory (RAM). The RAM includes a dynamic RAM and/or a static RAM, an on-chip and/or off-chip cache, and the like. The nonvolatile memory may be embedded and/or removable. The nonvolatile memory may include, for example, a read-only memory (ROM), a flash memory, a magnetic storage device such as a hard disk, a FLOPPY DISK drive, or a magnetic tape, an optical disc drive and/or a medium, and a nonvolatile RAM (NVRAM). Similar to the volatile memory, the nonvolatile memory may include a cache area used for temporary storage of data. At least a part of the volatile and/or nonvolatile memory may be embedded into the processor. The memory may store one or more software programs, instructions, information blocks, data, and the like. The memory may be used by the terminal device to perform a function of a mobile terminal. For example, the memory may include an identifier, for example, an International Mobile Equipment Identity (IMEI) code, that can uniquely identify the terminal device.

Although the present disclosure is described with reference to specific features and the embodiments thereof, it is clear that various modifications and combinations may be made to them without departing from the spirit and scope of the present disclosure. Correspondingly, the specification and accompanying drawings are merely example description of the present disclosure defined by the accompanying claims, and are considered as any of or all modifications, variations, combinations or equivalents that cover the scope of the present disclosure. It is clear that a person skilled in the art may make various modifications and variations to the present disclosure without departing from the spirit and scope of the present disclosure. The present disclosure is intended to cover these modifications and variations provided that they fall within the scope of protection defined by the following claims and their equivalent technologies.

What is claimed is:

1. An antenna comprising:

a plurality of surface radiating patches;

a plurality of inner radiating patches;

a plurality of antenna feeders coupled to the inner radiating patches;

an organic resin substrate comprising a first dielectric constant or a first dielectric loss, and a first coefficient of thermal expansion;

a first dielectric substrate disposed between the surface radiating patches and the inner radiating patches, wherein a second dielectric constant or a second dielectric loss of the first dielectric substrate is lower than the first dielectric constant or the first dielectric loss; and a second dielectric substrate disposed below the inner radiating patches and configured to carry a first part of the antenna feeders, wherein a second coefficient of thermal expansion of the second dielectric substrate is lower than the first coefficient of thermal expansion.

2. The antenna of claim 1, wherein the second dielectric constant is lower than 3.6.

3. The antenna of claim 1, wherein the second coefficient of thermal expansion is in a range between 0.7-10 parts per million (PPM)/degrees Celsius (° C.).

4. The antenna of claim 1, wherein a material of the first dielectric substrate is either polytetrafluoroethylene (PTFE) or a PTFE composite material comprising fiberglass cloth, and wherein the second dielectric constant is in a range between 2-2.5.

5. The antenna of claim 1, wherein a material of the second dielectric substrate is either a bismaleimide triazine (BT) resin substrate material or a glass epoxy multilayer material with a high glass transition temperature (Tg).

6. The antenna of claim 1, further comprising an adhesive layer or a layer of the organic resin substrate configured to fill a space between the surface radiating patches and the inner radiating patches.

7. The antenna of claim 1, further comprising a layer of the organic resin substrate configured to:

fill a space between the inner radiating patches and the second dielectric substrate; and carry a second part of the antenna feeders.

8. The antenna of claim 7, further comprising:

a plurality of shield layers; and a plurality of ground layers, wherein the organic resin substrate is further configured to carry each of the shield layers and each of the ground layers that are alternately disposed.

9. The antenna of claim 1, further comprising a layer of the organic resin substrate disposed outside the second dielectric substrate and configured to carry a second part of the antenna feeders.

10. The antenna of claim 1, wherein the surface radiating patches are arranged in a first N×N array on the first dielectric substrate, wherein the inner radiating patches are distributed in a second N×N array on the second dielectric substrate, wherein N is a positive integer greater than 1, and wherein the surface radiating patches and the inner radiating patches overlap in a direction perpendicular to the first dielectric substrate.

11. A communications apparatus comprising:

a transceiver comprising a receiver and a transmitter; and an antenna coupled to the receiver and the transmitter, wherein the antenna comprises:

a plurality of surface radiating patches;

a plurality of inner radiating patches;

a plurality of antenna feeders coupled to the inner radiating patches;

an organic resin substrate comprising a first dielectric constant or a first dielectric loss, and a first coefficient of thermal expansion;

a first dielectric substrate disposed between the surface radiating patches and the inner radiating patches, wherein a second dielectric constant or a second dielectric loss of the first dielectric substrate is lower than the second dielectric constant or the second dielectric loss; and a second dielectric substrate disposed below the inner radiating patches and configured to carry a first part of the antenna feeders, wherein a second coefficient of thermal expansion of the second dielectric substrate is lower than the first coefficient of thermal expansion.

12. The communications apparatus of claim 11, wherein the second dielectric constant is lower than 3.6.

13. The communications apparatus of claim 11, wherein the second coefficient of thermal expansion is in a range between 0.7-10 parts per million (PPM)/degrees Celsius (° C.).

14. The communications apparatus of claim 11, wherein a material of the first dielectric substrate is either polytetrafluoroethylene (PTFE) or a PTFE composite material comprising fiberglass cloth, and wherein the first dielectric constant is in a range between 2-2.5.

15. The communications apparatus of claim 11, wherein a material of the second dielectric substrate is either a bismaleimide triazine (BT) resin substrate material or a glass epoxy multilayer material with a high glass transition temperature (Tg).

16. The communications apparatus of claim 11, further comprising an adhesive layer or a layer of the organic resin substrate configured to fill a space between the surface radiating patches and the inner radiating patches.

17. The communications apparatus of claim 11, further comprising a layer of the organic resin substrate configured to:

fill a space between the inner radiating patches and the second dielectric substrate; and carry a second part of the antenna feeders.

18. The communications apparatus of claim 17, further comprising:

a plurality of shield layers; and a plurality of ground layers, wherein the organic resin substrate is further configured to carry each of the shield layers and each of the ground layers that are alternately disposed.

19. The communications apparatus of claim 11, further comprising a layer of the organic resin substrate disposed outside the second dielectric substrate and configured to carry a second part of the antenna feeders.

20. The communications apparatus of claim 11, wherein the surface radiating patches are arranged in a first N×N array on the first dielectric substrate, wherein the inner radiating patches are distributed in a second N×N array on the second dielectric substrate, wherein N is a positive integer greater than 1, and wherein the surface radiating patches and the inner radiating patches overlap in a direction perpendicular to the first dielectric substrate.

* * * * *